United States Patent [19]
Navratil

[11] 3,972,036
[45] July 27, 1976

[54] ARRANGEMENT FOR RAPID SWITCHING OF A HIGH FREQUENCY MAGNETIC FIELD

[75] Inventor: Franz Navratil, Munich, Germany

[73] Assignee: Siemens Aktiengesellschaft, Berlin & Munich, Germany

[22] Filed: Apr. 8, 1974

[21] Appl. No.: 458,754

[30] Foreign Application Priority Data
Apr. 12, 1973  Germany.............................. 2318530

[52] U.S. Cl. ........................... 340/174 TF; 331/45; 331/117 R
[51] Int. Cl.² ...................... G11C 11/14; H03F 3/55
[58] Field of Search ............... 340/174 TF, 174 TB; 307/246, 264, 270; 328/21, 173; 331/166, 173, 177 R, 128, 55, 45, 117 R

[56] References Cited
UNITED STATES PATENTS

| | | |
|---|---|---|
| 3,550,098 | 12/1970 | Heightley et al.............. 340/174 TB |
| 3,720,883 | 3/1973 | Hess, Jr. et al..................... 331/173 |
| 3,763,478 | 10/1973 | Yoshizawa et al. ........... 340/174 TF |
| 3,866,145 | 2/1975 | Hess, Jr......................... 340/174 TF |

*Primary Examiner*—James W. Moffitt
*Attorney, Agent, or Firm*—Hill, Gross, Simpson, Van Santen, Steadman, Chiara & Simpson

[57] ABSTRACT

An arrangement for rapidly switching a high frequency magnetic field includes parallel resonant circuits which are supplied with sine or cosine current, respectively, comprise coils which are arranged crosswise in respect of each other and a switching member is connected parallel to each coil. The switching member comprises a controllable voltage source which is connected by way of an RC circuit to an end of the resonant circuit, and a transistor is connected between the other end of the resonant circuit and a reference potential.

6 Claims, 2 Drawing Figures

ARRANGEMENT FOR RAPID SWITCHING OF A HIGH FREQUENCY MAGNETIC FIELD

BACKGROUND OF THE INVENTION

1. Field of the Invention

This invention relates to apparatus for rapidly switching a magnetic field, and more particularly to an arrangement for rapidly switching a high frequency magnetic field.

2. Description of the Prior Art

Known domain transport stores include a plate, and in particular layer-shaped, storage medium, for example comprising magnetic garnet or orthoferrite material having domains which are magnetized perpendicular to the layer and in a magnetizing direction that is opposite to the magnetizing direction of the surroundings thereof and to a magnetic support field. The domains furthermore dispose of a periodic manipulation pattern to which individual elements of magnetizable material are applied, for example a layer of NiFe alloy, in rectangles, onto one layer surface. A magnetic field which turns at a high frequency parallel to the plane of the layers serves for the transport of the cylinder domain.

In a magnetic field which during operation is designed as a magnetic rotary field, parallel to the plane of the layer of the storage medium, the above-mentioned magnetic individual elements of the manipulation pattern create magnetic scatter fields under which effect cylindrical domains travel to energetically more favorable positions at the individual elements.

When rotating the magnetic rotary field in the plane of the layer these energy minimums disappear. In their place new ones are created at other points of the manipulation pattern to which the domains travel. In case of suitable geometry of the manipulation pattern the cylinder domains move, in case of a complete rotation of the magnetic rotary field, by one period of the manipulation pattern, which means that the domains advance by one storage space. In a continuously rotating magnetic field, the cylinder domains can be transported on paths which are prescribed by the manipulation pattern.

The magnetic rotary field which is required for the transport of the cylinder domains is, as is generally known, created in a pair of coils which are aligned in an orthogonal manner with respect to each other, whereby for energy considerations the coils are in each case designed to form resonant circuits which are controlled by a sine or cosine current, respectively.

In order to achieve an ideally rotating magnetic field in the working space of the coil, the phase position and the amplitude of the control currents have to be closely observed, this being the reason while the control is preferably carried out by means of a phase-coupled double generator with independent amplitude control for both outputs. This structure guarantees that the terminal point of the magnetic field vector accurately forms a circle.

If a resonant circuit is caused to oscillate, due to the activation of the high frequency generator, the full energy and, therefore, also the full magnetic field strength can only be achieved after many periods of oscillation, since the generator can supply the resonant circuit with its initial impedance only with a limited power, which, consequently, constitutes a restriction at the start. The conditions are similar when the generator is switched off. The increasing or decreasing of the current amplitudes has an exponential characteristic and is unsuitable in this form for the purpose of domain transport.

In a domain transport the full field amplitude should be available at the time the generator is switched on or during its activation, respectively, so that all cylinder domains start simultaneously.

Otherwise, due to the change of the opposite phase position of the individual cylinder domains, the information is obscured; the individual cylinder domains are transported, however, other cylinder domains are not transported to the next storage space since the critical threshold value of the field amplitude has not yet been exceeded. Similar facts also apply to the switching off of the rotary magnetic field, whereby the amplitude of the field is interrupted abruptly, or should at least be brought below a level at which the transport of the cylinder domains does not take place.

Therefore, it is essential to accelerate the switching on and off of the magnetic field in the form of a switch. A switch which is arranged in series in the resonant circuit and which would offer itself for the solution of this problem is, however, only acceptable as far as the basic factors are concerned. The losses caused by such a switch are excessive in the field of the required rotary field current.

SUMMARY OF THE INVENTION

The primary object of the present invention is to provide an arrangement for rapid switching of a high frequency rotary magnetic field which eliminates the above-mentioned disadvantages.

In an arrangement of this type, which disposes of a crossed pair of coils and at least one high frequency generator which supplies the coils with a sine-shaped current displaced in phase by 90°, the invention provides for the solution of the aforementioned problem and the achievement of the foregoing object in that each coil is supplemented to form a parallel resonant circuit and that parallel to each coil a switching circuit is connected comprising a controllable voltage source which is connected by way of a timing circuit to one end of the parallel resonant circuit, and a switch is connected between the other end of the parallel resonant circuit and a reference potential.

The above-described arrangement makes it possible the use of a common power switching transistor as a switch, whereby the collector-emitter path of the transistor is used as a switching path and the transistor is controlled in its base-emitter circuit by way of a transformer. During the switching on, as well as during the switching off, of the rotary magnetic field, the transistor is cut through, which can be implemented much quicker than the transit into the blocking condition. Since the switching circuits do not draw energy during the operational condition from their parallel resonant circuit, and the circuit quality is not diminished by the switching circuits with the same control power a higher field amplitude is achieved, compared to the above-mentioned arrangement of switches, in particular transistors, in the resonant circuits.

Only the small internal resistances of the controllable voltage source, as well as the likewise small saturation resistance of the cut through transistor, enter the switching time constant. The timing circuit comprises an ohmic resistor connected in series between the reference potential and the resonant circuit and a capacitor connected in parallel with the resistor. Since the energy of each resonant circuit is practically diverted into the capacitor of its respective timing circuit which is effective as a storage capacitor, during the switching off cycle for later dissipation by the ohmic resistor of the timing circuit, the capacitor of the timing circuit must be larger than the capacity of the parallel resonant circuit.

In comparison to an arrangement with one transistor in the resonant circuit much less energy is required for the switching process.

The capacitance of each parallel resonant circuit preferably comprises two capacitors connected in series with the junction thereof connected to the high frequency generator.

BRIEF DESCRIPTION OF THE DRAWING

Other objects, features and advantages of the invention, its organization, construction and operation will be best understood from the following detailed description of a preferred embodiment of the invention taken in conjunction with the accompanying drawing, on which.

Figure 1:
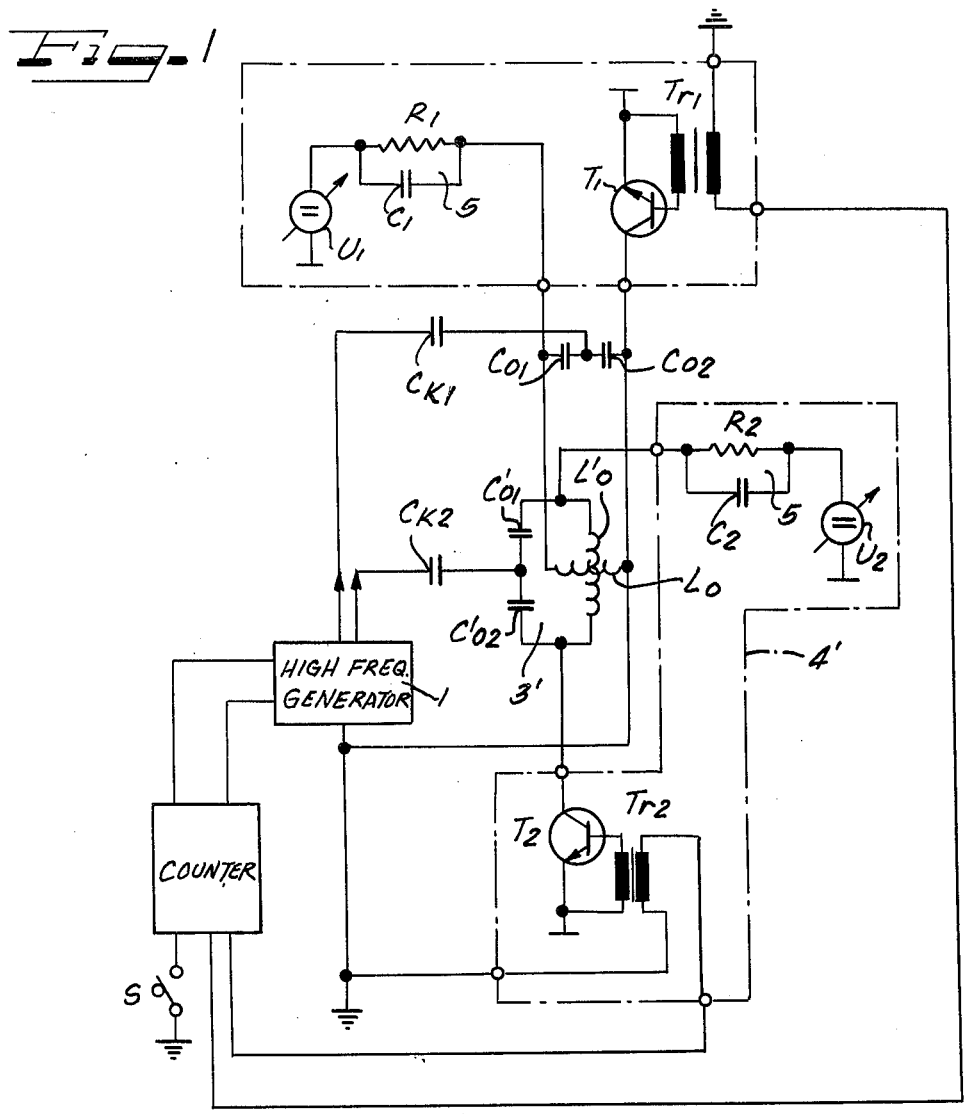
FIG. 1 illustrates a circuit diagram of an arrangement constructed according to the invention.

The components of the circuit producing the rotating field, that is the parallel resonant circuits 3, 3', are coupled with a high frequency generator 1 via coupling capacitors $C_{K1}$, $C_{K2}$, and are fed by the high frequency generator. The high frequency generator 1 is preferably designed as a phase-coupled dual generator with independent amplitude control for both outputs, by means of which it is achieved that the terminal point of the field vector accurately forms a circle.

The capacitance of the parallel resonant circuits 3, 3' is realized by two capacitors $C_{o1}$ and $C_{o2}$ or $C'_{o1}$ and $C'_{o2}$, respectively, which are connected in series with a junction thereof being connected to the high frequency generator 1. The resonant circuit inductances $L_o$, $L'_o$ are connected in parallel to the capacitors $C_{o1}$ and $C_{o2}$ or $C'_{o1}$ and $C'_{o2}$, respectively, which are correspondingly dimensioned in order to guarantee the adjustment of the high frequency generator to the parallel resonant circuits 3, 3'.

The switching elements 4, 4' which are indicated in the drawing with broken lines are connected in parallel to the inductances $L_o$, $L'_o$, with the switching elements 4, 4' each consisting of a controllable voltage source $U_1$ and $U_2$, respectively, connected to one terminal point of the parallel resonant circuit 3 or 3' via a timing element 5, 5' and consisting of a transistor $T_1$ and $T_2$ which is connected between the other terminal point of the parallel resonant circuit 3, 3' and the reference potential and a transformer $T_{r1}$ and $T_{r2}$, respectively. The transformers $T_{r1}$, $T_{r2}$ provide the necessary separation of the transistors $T_1$, $T_2$ from the ground potential of the other switching element. The timing circuits 5, 5' consist of an ohmic resistor $R_1$ and $R_2$, serially connected, and a respective capacitor $C_1$ and $C_2$, respectively, connected in parallel therewith. A counter 2 having a program selection and which can be operated by a switch S is connected to the high frequency generator 1 and controls the transformer $T_{r1}$ and the transistor $T_1$, or the transformer $T_{r2}$ and the transistor $T_2$, respectively, via a line 8 and 8' respectively.

Figure 2:
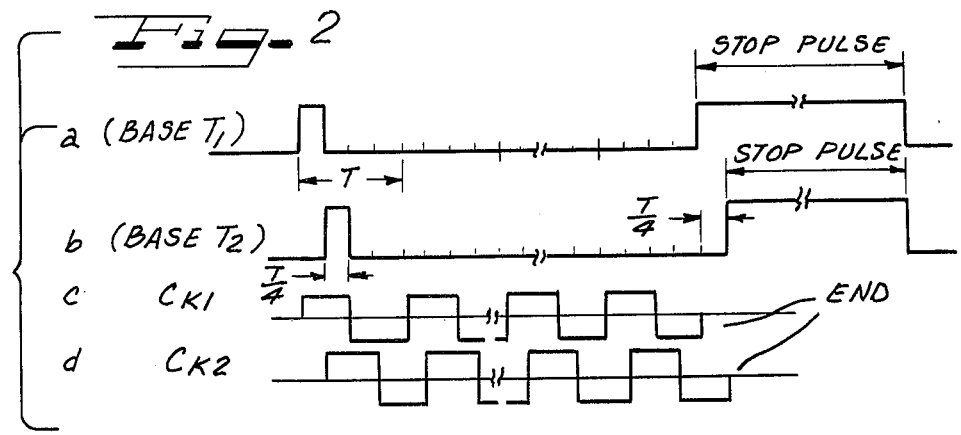
FIG. 2 illustrates a pulse succession diagram for the circuit of FIG. 1.

The mode of operation of the arrangement is as follows:

If the cylinder domains are to be transported, and for this purpose the high frequency rotary magnetic field is to be activated, the program cycle of the counter 2 serving as a program generator is released, at first, by operating the switch S, and the base of each transistor $T_1$, $T_2$ is switched through by each pulse succession a and b, respectively, which are mutually shifted in phase by 90° (see FIG. 2). The start pulses of the base currents of the transistors $T_1$ and $T_2$ should thereby have a duration of a quarter period. During this time, the resulting capacitances $C_{res}$ of the capacitors $C_{o1}$ and $C_{o2}$ and $C'_{o1}$ and $C'_{o2}$, respectively, of the parallel resonant circuits 3, 3' is charged each time via the other respective timing element 5 and 5' to the adjusted direct voltage of the direct voltage source $U_1$ and $U_2$, respectively. Thereafter, the resulting capacitances $C_{res}$ discharge via the inductances $L_o$, $L'_o$ of the resonant circuits 3, 3', which at first leads to a damped oscillation of the parallel resonant circuits. At the same time, the pulse successions c illustrated in FIG. 2 and the pulse succession d which is shifted in phase by 90° with respect to the pulse succession c, are emitted by the high frequency generator 1, and are fed to the resonant circuits 3, 3' via the corresponding coupling capacitors $C_{K1}$, $C_{K2}$ in order to compensate for the losses of energy of the resonant circuits, i.e., in order to maintain the oscillation amplitudes in the resonant circuits 3, 3' which are preselected by the direct voltage sources $U_1$, $U_2$, respectively. The start or switch on process can be compared with the addition of two damped oscillations, whereby one diminishes exponentially after the charging process and the other increases exponentially gradually through the high frequency generator. The result is an oscillation of continuous amplitude which makes a start within a quarter period possible. The resistor $R_1$, $R_2$ of the timing element 5 and 5', respectively, effects that the initial condition of the capacitor $C_1$ and $C_2$, respectively, which becomes active during the switching on and off of the rotary magnetic field, always remains the same, i.e., that the charge caused by the switching on and off of the capacitor $C_1$ and $C_2$ is again reduced.

If the transport of the cylinder domains is interrupted, which is caused by the switching off of the rotary magnetic field, the switch S is activated at first and by means of this operation stop pulses in the counter 2 are released, which are illustrated in FIG. 2, trace a or trace b, at the right hand side, and the pulses are conducted to the bases of the transistors $T_1$, $T_2$ whereby the pulses have a duration of several periods in order to guarantee a secure switching off period. In a sequence preselection, this action takes place automatically by the counter 2. Simultaneously with the introduction of the stop process, the feed-in of the pulse successions c and d (FIG. 2) into the resonant circuits 3 and 3', respectively, is terminated.

Due to the fact that the transistors $T_1$, $T_2$ are now switched through for several periods, the parallel resonant circuits are immediately slowed down via the saturation resistances of the transistors $T_1$, $T_2$, the timing elements 5, 5' and the small internal resistances of the current or voltage sources $U_1$, $U_2$, respectively. The predominant portion of energy of the parallel resonant circuits 3, 3' is practically derived in the switching off cycle, i.e., during the stop-pulse duration (see FIG. 2, pulse sequence a or b, respectively), via the capacitors $C_1$, $C_2$, and it is dissipated by the resistors $R_1$, $R_2$ of the timing element 5, 5'. Therefore, it is important that the capacitances of the capacitors $C_1$, $C_2$ amount to a multiple of the resulting capacitance $C_{res}$ of the parallel resonant circuits 3, 3'. Generally, a switching circuit capacitance suffices which is approximately ten times larger than the resulting capacitance $C_{res}$ of the parallel resonant circuits 3, 3'.

The dimensioning of the RC circuits 5, 5' basically depends on the shortest time interval during which a reactivating of the resonant field of the parallel resonant circuits 3, 3' may become necessary.

It is essential for the operation of the entire arrangement that the transistors $T_1$, $T_2$ remain correctly polarized on one side, on the side of the collector. In this case, in which an npn transistor is utilized, a positive voltage should be available at the collector in order to prevent a switch-through of the transistors $T_1$, $T_2$ and, thus, the parallel resonant circuits 3, 3' are damped. This condition is fulfilled by the voltages $U_{reg}$ provided from the current or voltage sources $U_1$, $U_2$, respectively, which voltages $U_{reg}$ are at the same time prescribed as the starting amplitudes during the switching-on process.

I claim:

1. An arrangement for rapidly switching on and off a high frequency rotary magnetic field, comprising: a pair of crossed coils; high frequency generating means connected to said coils and feeding said coils a sine-shaped current which is out of phase by 90° at one coil with respect to the other, a separate capacitance connected across each of said coils to form respective parallel resonant circuits, and a pair of switching circuits connected in parallel to respective ones of said resonant circuits, each of said switching circuits comprising a controllable voltage source, a timing circuit connecting said controllable voltage source to one end of the respective parallel resonant circuit and a switch connecting the other end of the respective parallel resonant circuit to a reference potential.

2. An arrangement according to claim 1 wherein said switch is a transistor including a collector-emitter switching path connected to said resonant circuit and to said reference potential and a base, and a pulse transformer connected to said base and connected to receive control pulses for operating said transistor.

3. An arrangement according to claim 1 in combination with a domain transport store, said rotary magnetic field magnetically coupled to said store.

4. An arrangement for rapidly switching on and off a high frequency rotary magnetic field, comprising: a pair of crossed coils; high frequency generating means connected to said coils and feeding said coils a sine-shaped current which is out of phase by 90° at one coil with respect to the other, a separate capacitance connected across each of said coils to form respective parallel resonant circuits, and a pair of switching circuits connected in parallel to respective ones of said resonant circuits, each of said switching circuits comprising a controllable voltage source, a timing circuit connecting said controllable voltage source to one end of the respective parallel resonant circuit and a switch connecting the other end of the respective parallel resonant circuit to a reference potential, the capacitance of each of said parallel resonant circuits comprising a pair of serially connected capacitors connected to said high frequency generating means at the junction therebetween.

5. An arrangement for rapidly switching on and off a high frequency rotary magnetic field, comprising: a pair of crossed coils; high frequency generating means connected to said coils and feeding said coils a sine-shaped current which is out of phase by 90° at one coil with respect to the other, a separate capacitance connected across each of said coils to form respective parallel resonant circuits, and a pair of switching circuits connected in parallel to respective ones of said resonant circuits, each of said switching circuits comprising a controllable voltage source, a timing circuit connecting said controllable voltage source to one end of the respective parallel resonant circuit and a switch connecting the other end of the respective parallel resonant circuit to a reference potential, said timing circuit comprising a resistor connected in series between said controllable voltage source and the respective resonant circuit, and a capacitor connected in parallel to said resistor.

6. An arrangement for rapidly switching on and off a high frequency rotary magnetic field, comprising: a pair of crossed coils; high frequency generating means connected to said coils and feeding said coils a sine-shaped current which is out of phase by 90° at one coil with respect to the other, a separate capacitance connected across each of said coils to form respective parallel resonant circuits, and a pair of switching circuits connected in parallel to respective ones of said resonant circuits, each of said switching circuits comprising a controllable voltage source, a timing circuit connecting said controllable voltage source to one end of the respective parallel resonant circuit and a switch connecting the other end of the respective parallel resonant circuit to a reference potential, said timing circuit comprising a resistor connected in series between said controllable voltage source and the respective resonant circuit, and a capacitor connected in parallel with said resistor and having a capacitance which is larger than the capacitance of the respective parallel resonant circuit.

* * * * *